United States Patent
Ishimura et al.

(10) Patent No.: US 7,893,460 B2
(45) Date of Patent: Feb. 22, 2011

(54) SEMICONDUCTOR LIGHT DETECTING ELEMENT INCLUDING FIRST AND SECOND MULTILAYER LIGHT REFLECTIVE STRUCTURES SANDWICHING AND CONTACTING A LIGHT ABSORPTIVE LAYER

(75) Inventors: Eitaro Ishimura, Tokyo (JP); Masaharu Nakaji, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 12/124,337

(22) Filed: May 21, 2008

(65) Prior Publication Data

US 2009/0218595 A1 Sep. 3, 2009

(30) Foreign Application Priority Data

Feb. 28, 2008 (JP) ............................. 2008-047334

(51) Int. Cl.
*H01L 31/0216* (2006.01)
(52) U.S. Cl. ................. 257/186; 257/184; 257/225; 257/290; 257/431; 257/432; 257/437; 257/461; 257/E31.019; 257/E31.059
(58) Field of Classification Search ............ 257/184, 257/186, 196, 436, 437, 458, 459, E31.061, 257/E31.032, E31.128, 215, 225, 288–290, 257/428, 431–432, 461, 466, E31.003, E31.004, 257/E31.019, E31.02, E31.021, E31.022, 257/E31.059
See application file for complete search history.

(56) References Cited

U.S. PATENT DOCUMENTS 5,518,934 A * 5/1996 Forrest et al. ................. 438/73
5,880,489 A 3/1999 Funaba et al.
2004/0056250 A1 * 3/2004 Wang et al. .................... 257/53
2008/0121867 A1 * 5/2008 Yagyu et al. ................... 257/21

FOREIGN PATENT DOCUMENTS

| JP | 62-242374 A | 10/1987 |
| JP | 63-269580 A | 11/1988 |
| JP | 9-45954 A | 2/1997 |
| JP | 2001-308368 A | 11/2001 |
| WO | WO 2006046276 A1 * | 5/2006 |

OTHER PUBLICATIONS

Kuchibhotlal, R. et al.; "Low-Voltage High-Gain Resonant-Cavity Avalanche Photodiode", *IEEE Photonics Technology Letters.*, vol. 3, No. 4, pp. 354-356, (Apr. 1991).

* cited by examiner

*Primary Examiner*—A. Sefer
*Assistant Examiner*—Ermias Woldegeorgis
(74) *Attorney, Agent, or Firm*—Leydig, Voit & Mayer, Ltd.

(57) ABSTRACT

A semiconductor light detecting element comprises: a semiconductor substrate having a first major surface and a second major surface opposite each other; a first reflective layer, an absorptive layer, a phase adjusting layer, and a second reflective layer sequentially disposed, from the semiconductor substrate, on the first major surface of the semiconductor substrate; and an anti-reflection film on the second major surface of the semiconductor substrate. The first reflective layer is a multilayer reflective layer including laminated semiconductor layers having different refractive indices; the absorptive layer has a band gap energy smaller than band gap energy of the semiconductor substrate; the phase adjusting layer has a band gap energy larger than the band gap energy of the absorptive layer; and the first reflective layer contacts the absorptive layer, without intervention of other layers.

14 Claims, 12 Drawing Sheets

SEMICONDUCTOR LIGHT DETECTING ELEMENT INCLUDING FIRST AND SECOND MULTILAYER LIGHT REFLECTIVE STRUCTURES SANDWICHING AND CONTACTING A LIGHT ABSORPTIVE LAYER

BACKGROUND OF THE INVENTION

1. Field of the Invention

The present invention relates to a semiconductor light receiving element that can improve wavelength stability.

2. Background Art

Figure 9:
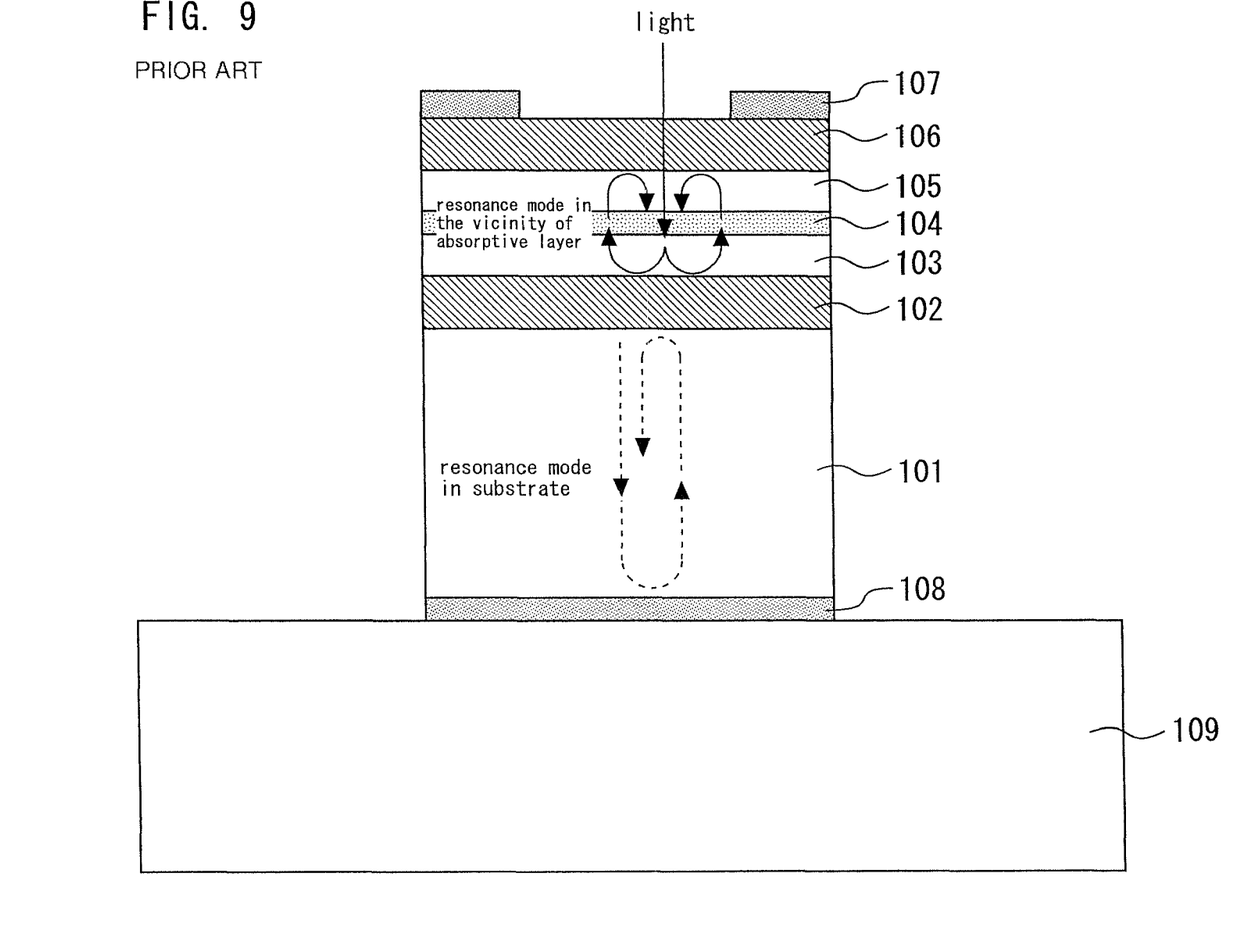
FIG. 9 is a sectional view showing a surface incidence resonance photodiode (PD).

FIG. 9 is a sectional view showing a surface incidence resonance photodiode (PD). An n-type multilayer reflective layer 102, an n-type phase adjusting layer 103, an i-type InGaAs absorptive layer 104, a p-type phase adjusting layer 105, and a p-type multilayer reflective layer 106 are sequentially formed on an upper surface of an n-type InP substrate 101. An anode 107 is formed on the p-type multilayer reflective layer 106, and a cathode 108 is formed on a lower surface of the n-type InP substrate 101. The PD is mounted on a pedestal 109.

The n-type multilayer reflective layer 102 and the p-type multilayer reflective layer 106 are layers formed by laminating semiconductor layers having different refractive indices, for example, InP and InGaAsP, and have a function to reflect or transmit light. The n-type phase adjusting layer 103 and the p-type phase adjusting layer 105 have larger band gaps than a band gap of the absorptive layer 104.

Next, the operation of the above-described resonance PD will be briefly described. A reverse bias of about 5 V is applied so that the potential of the anode 107 is lower than the potential of the cathode 108. Light incident from the upper side of the drawing is absorbed in the absorptive layer 104 while reciprocating (resonating) between the n-type multilayer reflective layer 102 and the p-type multilayer reflective layer 106. Pairs of electrons and holes are generated from the absorbed light, and flow to the sides of the cathode 108 and the anode 107, respectively, and are outputted as current. In the resonance PD, since light is absorbed after reciprocating (resonating) many times, high quantum efficiency can be obtained and the resonance Q value of light can be elevated even if the absorptive layer is thinned. The quantum efficiency is the probability of the generation of an electron-hole pair when a photon is incident into the PD.

Figure 10:
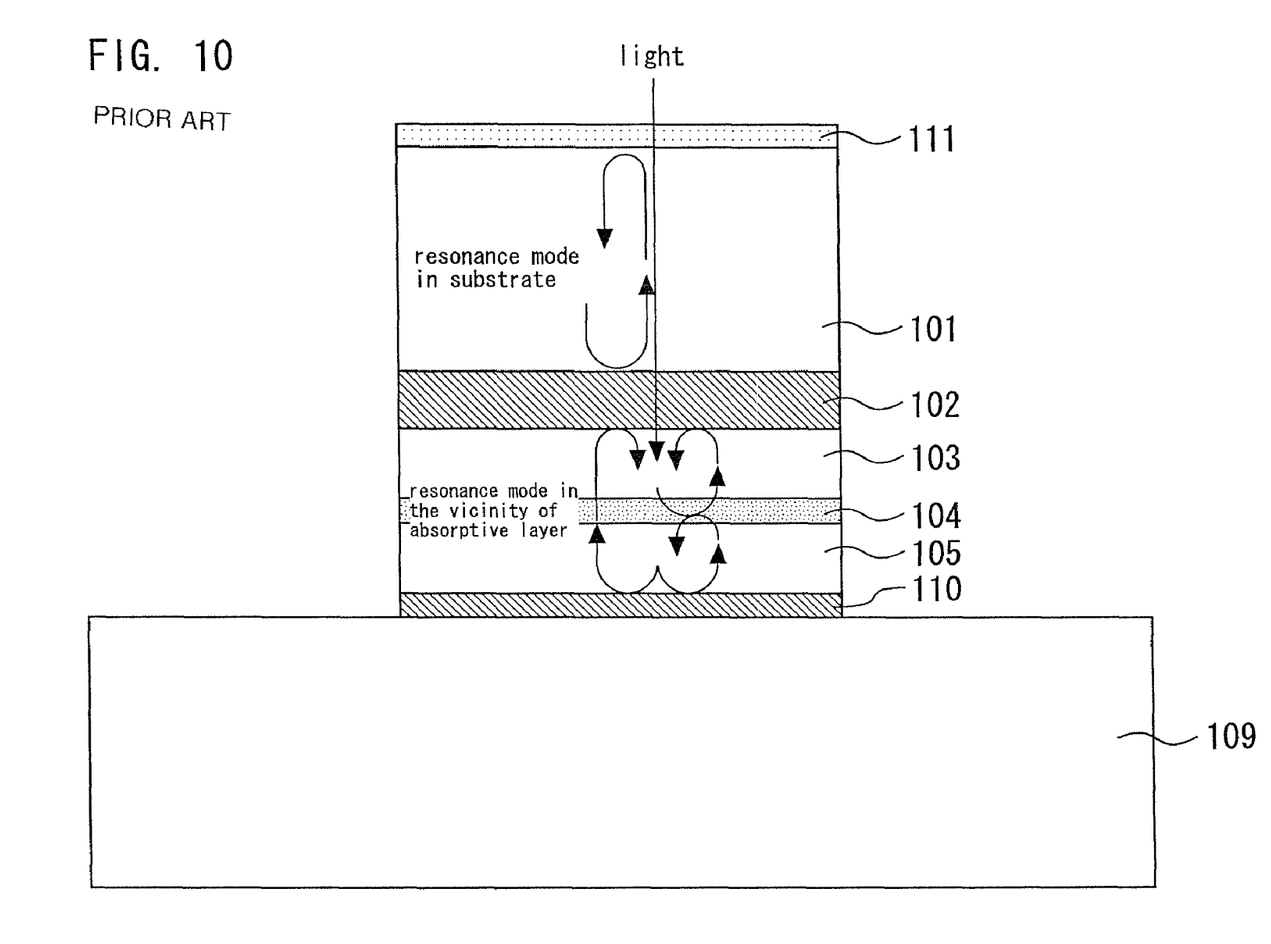
FIG. 10 is a sectional view showing a backside incidence resonance photodiode (PD).

FIG. 10 is a sectional view showing a backside incidence resonance photodiode (PD). An n-type multilayer reflective layer 102, an n-type phase adjusting layer 103, an i-type InGaAs absorptive layer 104, a p-type phase adjusting layer 105, and a reflective layer 110 are sequentially formed on a lower surface of an n-type InP substrate 101. An anti-reflection film 111 is formed on an upper surface of the n-type InP substrate 101. Light incident from the upper side of the drawing is absorbed in the absorptive layer 104 while reciprocating (resonating) between the n-type multilayer reflective layer 102 and the reflective layer 110 (for example, refer to Japanese Patent Laid-Open No. 2001-308368).

SUMMARY OF THE INVENTION

Figure 11:
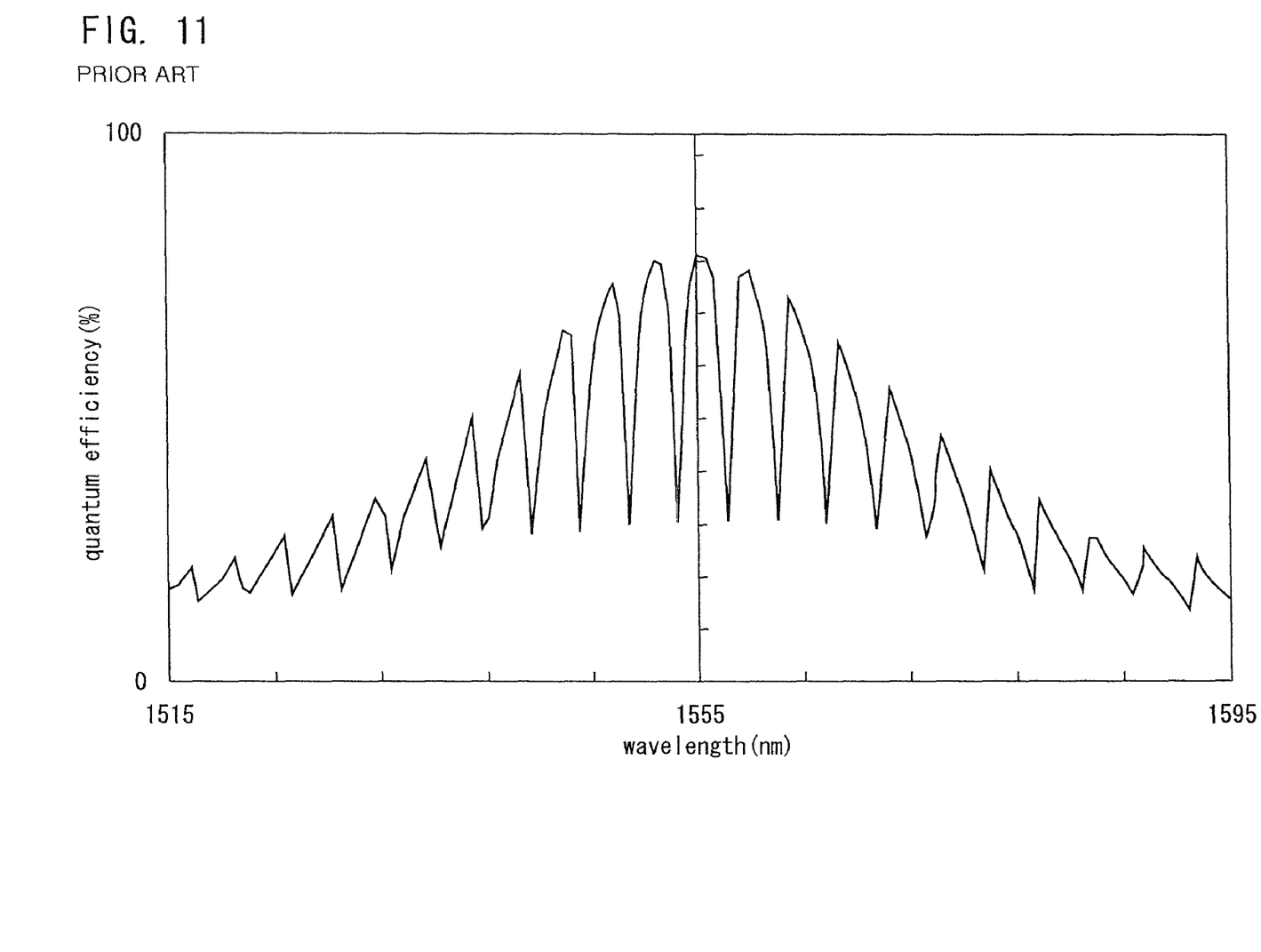
FIG. 11 is a graph showing the result of simulating the wavelength dependence of the quantum efficiency in the PD shown in FIG. 9.
Figure 12:
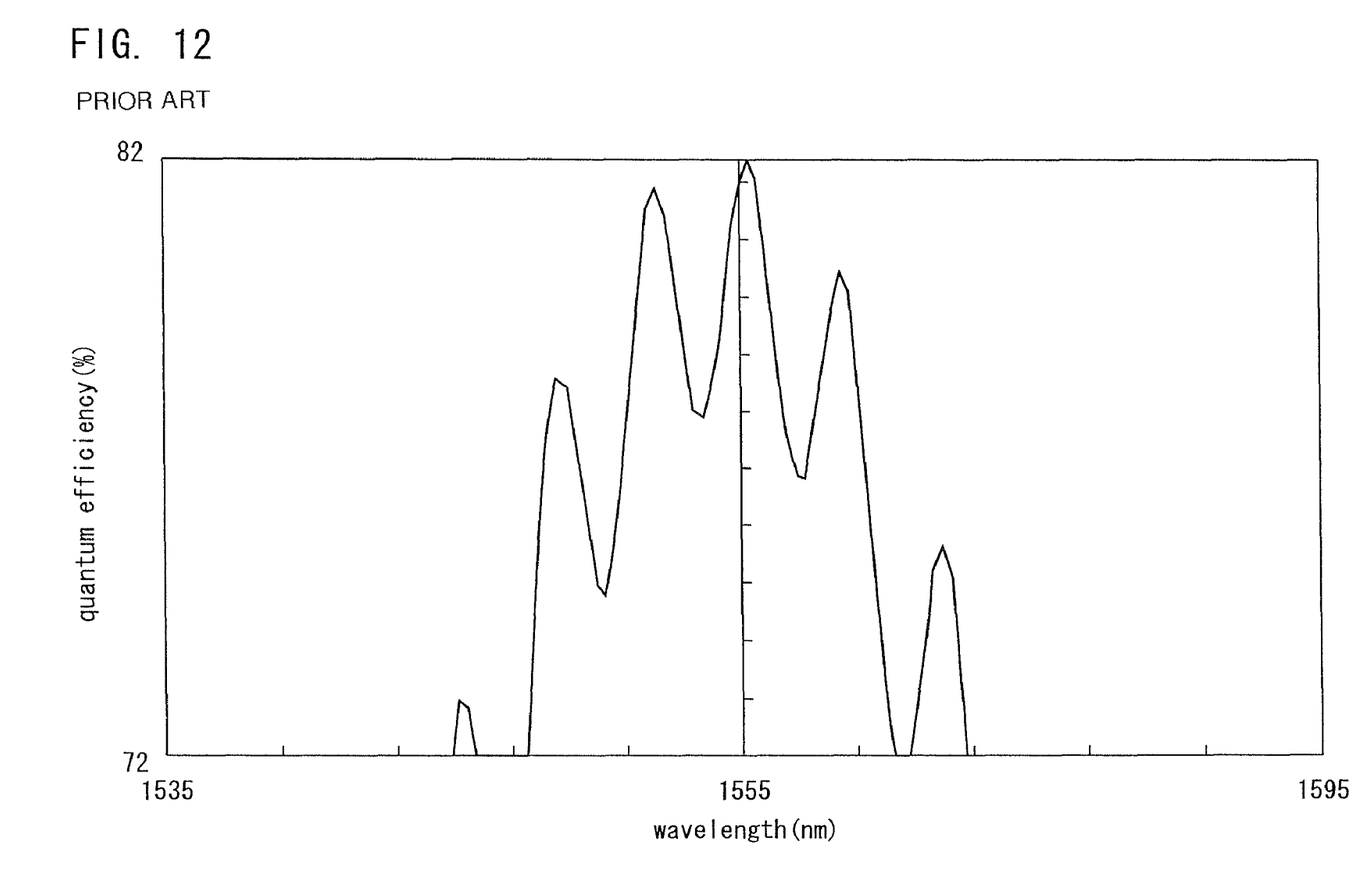
FIG. 12 is a graph showing the result of simulating the wavelength dependence of the quantum efficiency in the PD shown in FIG. 10.

FIGS. 11 and 12 are graphs showing the results of simulating the wavelength dependence of the quantum efficiency in PDs shown in FIGS. 9 and 10. When the wavelength of incident light is changed, quantum efficiency is radically changed in a fine period of several nanometers. Therefore, even if the wavelength of incident light was changed only by as small as 1 nm, a current outputted from the PD was significantly changed, and wavelength stability was low.

Therefore, the present inventors analyzed why the wavelength dependence of the quantum efficiency was high in the PDs shown in FIGS. 9 and 10. In the PD shown in FIG. 9, a part of light incident into the absorptive layer 104 transmits in the n-type multilayer reflective layer 102 and enters into the n-type InP substrate 101. Then, the light that has entered in the n-type InP substrate 101 reciprocates between the cathode 108 and the n-type multilayer reflective layer 102, and generates a resonance mode in the n-type InP substrate 101. On the other hand, in the vicinity of the absorptive layer 104, the mode between the n-type multilayer reflective layer 102 and the p-type multilayer reflective layer 106, the mode between the n-type multilayer reflective layer 102 and the absorptive layer 104, and the mode between the p-type multilayer reflective layer 106 and the absorptive layer 104 are present. The present inventors clarified by calculations that since the three resonance modes in the vicinity of the absorptive layer 104 interfered with the resonance mode in the n-type InP substrate 101 to generate a composite resonance mode, the above-described wavelength dependence of quantum efficiency was generated. It was especially found that the resonance mode generated in the n-type phase adjusting layer 103 in the side close to the n-type InP substrate 101 joins with the resonance mode in the n-type InP substrate 101 to easily form a composite resonance mode, and strongly affects the wavelength dependence of quantum efficiency.

To solve the above-described problems, it is an object of the present invention to provide a semiconductor light receiving element that can improve wavelength stability.

According to one aspect of the present invention, a semiconductor light receiving element comprises: a semiconductor substrate having a first major surface and a second major surface opposite to each other; a first reflective layer, an absorptive layer, a phase adjusting layer, and a second reflective layer sequentially formed from said semiconductor substrate side on said first major surface of said semiconductor substrate; and an anti-reflection film formed on said second major surface of said semiconductor substrate, wherein: said first reflective layer is a multilayer reflective layer formed by laminating semiconductor layers having different refractive indices; said absorptive layer has a band gap smaller than a band gap of said semiconductor substrate; said phase adjusting layer has a band gap larger than a band gap of said absorptive layer; and said first reflective layer contacts said absorptive layer without intervention of other layers.

According to the present invention, wavelength stability can be improved.

Other and further objects, features and advantages of the invention will appear more fully from the following description.

DETAILED DESCRIPTION OF THE PREFERRED EMBODIMENTS

First Embodiment

Figure 1:
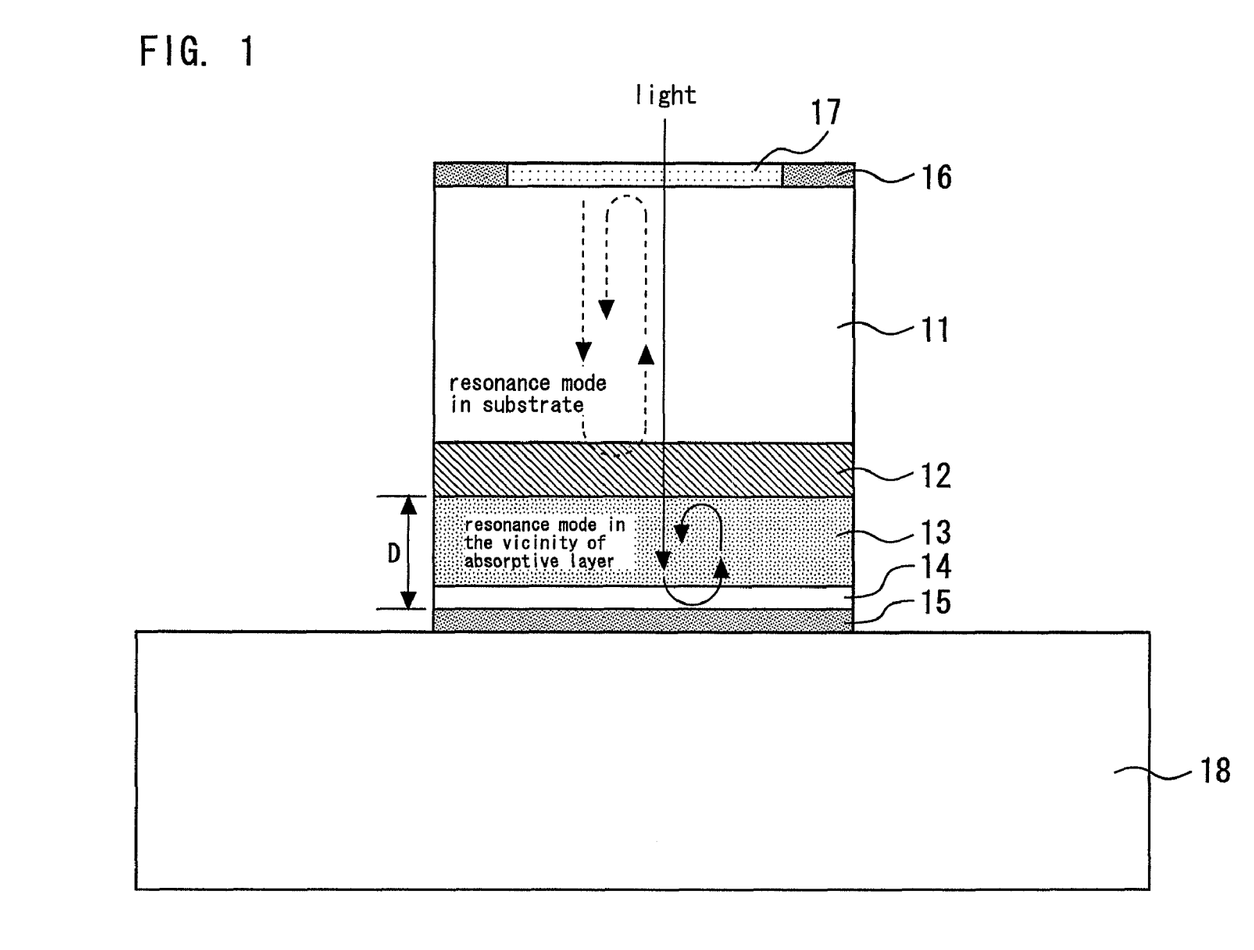
FIG. 1 is a sectional view showing a semiconductor light receiving element according to the first embodiment of the present invention.

FIG. 1 is a sectional view showing a semiconductor light receiving element according to the first embodiment of the present invention. The semiconductor light receiving element according to the present embodiment is a backside incidence resonance photodiode (PD) receiving light radiated from the upper side of the drawing.

An n-type InP substrate 11 (semiconductor substrate) has a lower surface (first major surface) and an upper surface (second major surface) opposite to each other. An n-type multilayer reflective layer 12 (first reflective layer), an absorptive layer 13, a p-type phase adjusting layer 14 (phase adjusting layer), and an anode 15 (second reflective layer) are formed sequentially on the lower surface of the n-type InP substrate 11 from the side of the n-type InP substrate 11. A cathode 16 is formed on the upper surface of the n-type InP substrate 11. The cathode 16 has an opening for receiving light. An anti-reflection film 17 is formed in the opening of the cathode 16. The PD is mounted on a pedestal 18.

Here, the n-type multilayer reflective layer 12 is a multilayer reflective layer formed by laminating semiconductor layers having different refractive indices. The optical thickness of each layer is determined to be n-times (n=1, 3, 5, 7, . . . ) about one-fourth of the wavelength incident into the PD. Specifically, as the n-type multilayer reflective layer 12, the combination of InGaAs/InP, InGaAsP/InP, AlInAs/AlGaInAs, AlInAs/InGaAs or the like; InGaAsP/InGaAsP or AlGaInAs/AlGaInAs having different compositions; or the combination of three or more of these materials are used.

The absorptive layer 13 is composed of a material having a smaller band gap than the band gap of the n-type InP substrate 11, such as InGaAs, InGaAsP and AlGaInAs, normally having a low carrier concentration. The optical thickness of the absorptive layer 13 is preferably larger than about one-fourth the wavelength incident into the PD. The anti-reflection film 17 is composed of an insulating film (dielectric film), such as SiN and TiO$_2$/SiO$_2$. The anode 15 has a function to reflect light that has transmitted trough the absorptive layer 13, and feed back the light to the absorptive layer 13. The pedestal 18 has functions to supply power to the anode 15, and to dissipate heat generated in the PD.

The p-type phase adjusting layer 14 is composed of a material having a larger band gap than the band gap of the absorptive layer 13. However, the p-type phase adjusting layer 14 may be composed of InGaAsP or AlGaInAs, and alternatively, a p-type region may be formed in an i-type InP layer by selective dispersion.

The effect of the semiconductor light receiving element according to the first embodiment will be described. Light incident from the anti-reflection film 17 transmits through the n-type multilayer reflective layer 12, enters into the absorptive layer 13, and absorbed into the absorptive layer 13 while reciprocating (resonating) between the anode 15 and the n-type multilayer reflective layer 12. Therefore, high quantum efficiency can be obtained even if the absorptive layer is thinned.

Light reflected by the n-type multilayer reflective layer 12 returns to the n-type InP substrate 11 again. Since the anti-reflection film 17 on the upper surface of the n-type InP substrate 11 has a residual reflectivity of actually about 0.4%, the reflected light is not discharged into outer space, and generates the resonance mode in the n-type InP substrate 11.

Here, in PDs shown in FIGS. 9 and 10, since the n-type phase adjusting layer 104 is present in the side close to the n-type InP substrate 101 viewed from the absorptive layer 104, the resonance mode in the n-type phase adjusting layer 104 joins to the resonance mode in the n-type InP substrate 101 to form a composite resonance mode. On the other hand, in the first embodiment, the n-type multilayer reflective layer 12 contacts the absorptive layer 13 without the intervention of other layers. Specifically, no phase adjusting layer is present in the side close to the n-type InP substrate 11 viewed from the absorptive layer 13. Therefore, the composite resonance mode can be reduced, and wavelength stability can be improved.

Figure 2:
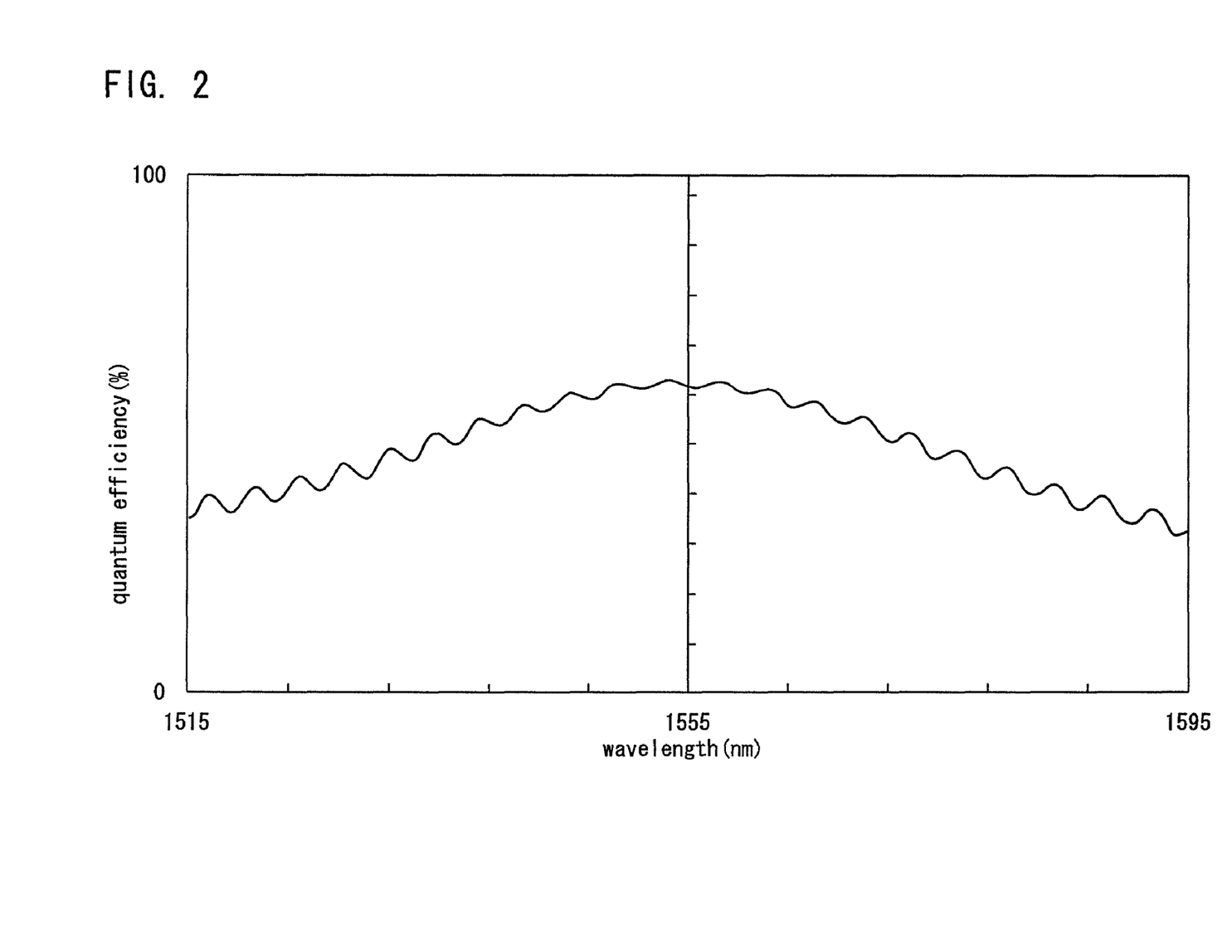
FIG. 2 is a graph showing the result of simulating the wavelength dependence of the quantum efficiency in the semiconductor light receiving element shown in FIG. 1.

FIG. 2 is a graph showing the result of simulating the wavelength dependence of the quantum efficiency in the semiconductor light receiving element shown in FIG. 1. In this calculation, the reflectivity of the anti-reflection film 17 was determined to be 0.4%. When FIG. 2 is compared with FIGS. 11 and 12, the fluctuation of quantum efficiency generated in a short cycle is clearly decreased. For example, in FIG. 11, the quantum efficiency changes by 50% at maximum when the wavelength changes by about 4 nm, while in FIG. 2 change in quantum efficiency is 2 to 3% or less even if the wavelength changes by 4 nm.

In addition, when the optical thickness of the absorptive layer 13 is sufficiently larger than the one-fourth the wavelength of incident light, since Q value of resonance in the absorptive layer 13 is lowered, the composite resonance mode is more difficult to generate.

A distance D between the n-type multilayer reflective layer 12 to be a resonating end surface and the anode 15 is the same as the total thickness of the absorptive layer 13 and the p-type phase adjusting layer 14. Therefore, if the thickness of the absorptive layer 13 is larger than the thickness of the p-type phase adjusting layer 14, more than half the distance D is occupied by the absorptive layer 13, and the Q value of resonance in the absorptive layer 13 is rapidly lowered, and the composite resonance mode is more difficult to generate. For example, when 60% of the distance D is occupied by the absorptive layer 13, the wavelength dependence of quantum efficiency is not substantially generated in the vicinity of the wavelength of 1555 nm.

Furthermore, the thickness of the p-type phase adjusting layer 14 is adjusted so that the total optical thickness of the absorptive layer 13 and the p-type phase adjusting layer 14 is an integral multiple of one-fourth the wavelength of incident light. Thereby, the recombination of electrons and holes generated in the absorptive layer 13 in the boundary between the p-type phase adjusting layer 14 and the anode 15 can be prevented. Then, the phase of light reflected from the anode 15 is adjusted so that resonance occurs in the absorptive layer 13 for a desired wavelength.

Figure 3:
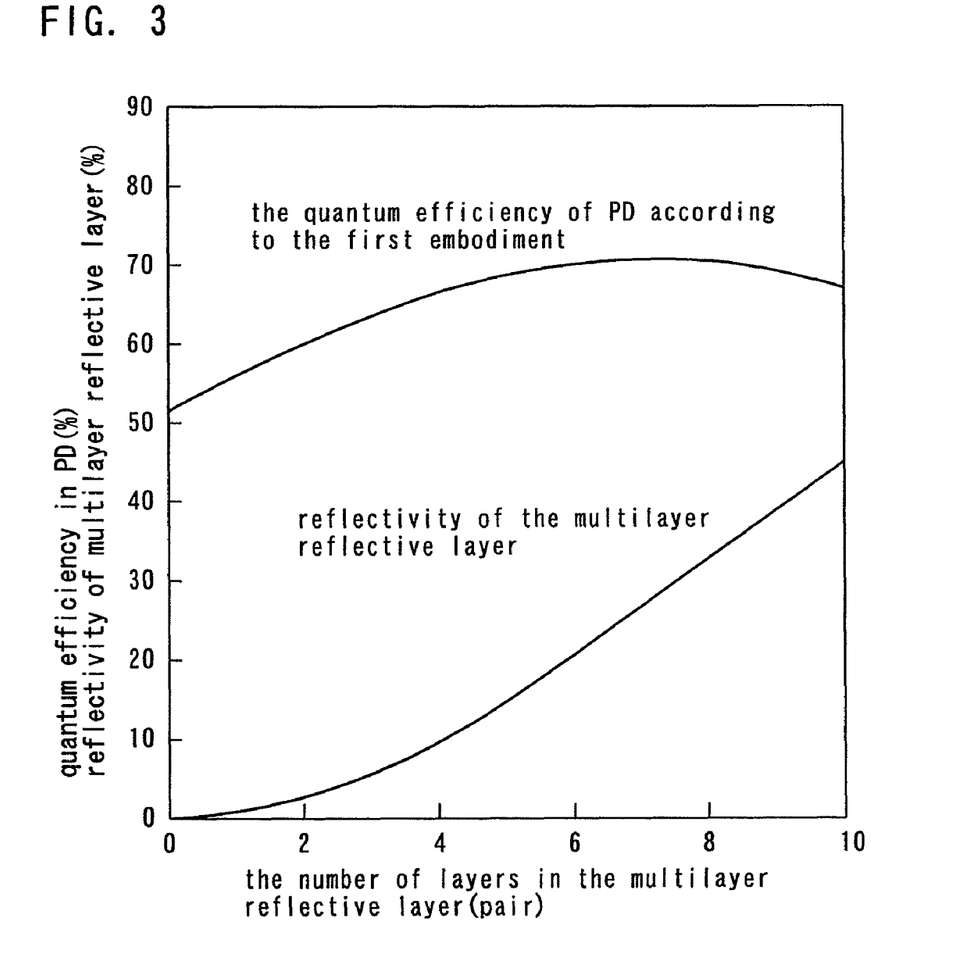
FIG. 3 is a graph showing the quantum efficiency of a semiconductor light receiving element according to the first embodiment of the present invention, and dependence of reflectivity of the multilayer reflective layer on the number of layers.

FIG. 3 is a graph showing the quantum efficiency of a semiconductor light receiving element according to the first embodiment of the present invention, and dependence of reflectivity of the multilayer reflective layer on the number of layers. It is known that the quantum efficiency of the PD elevates when the number of layers in the n-type multilayer reflective layer 12 is five to ten pairs. In this case, the reflectivity of the n-type multilayer reflective layer 12 is 20% to 70%. This is because resonance in the absorptive layer 13 occurs easily when the reflectivity of the n-type multilayer reflective layer 12 is elevated, but light incident into the absorptive layer decreases when the reflectivity is excessively elevated.

It is also desired that the reflectivity of the anode 15 is 40% or more. When the reflectivity of the anode 15 is higher, the quantum efficiency of the PD becomes higher.

In PDs shown in FIGS. 9 and 10, since the absorptive layer is sandwiched by multilayer reflective layers of poor heat conductivity, generated heat is confined and the temperature of the absorptive layer is elevated. The multilayer reflective layers frequently have high electric resistance, which causes heat generation. By such temperature elevation, the wavelength dependence of quantum efficiency is changed. Whereas in the first embodiment, no multilayer reflective layer is present between the pedestal 18 and the absorptive layer 13. Therefore, since heat generation is slight and heat is little confined, the stability of quantum efficiency can be achieved.

The n-type InP substrate 11 can be replaced by an Fe-doped InP substrate, which has high optical transparency. In this case, the cathode 16 must be separately connected to an n-type semiconductor layer, such as the n-type multilayer reflective layer 12.

Second Embodiment

Figure 4:
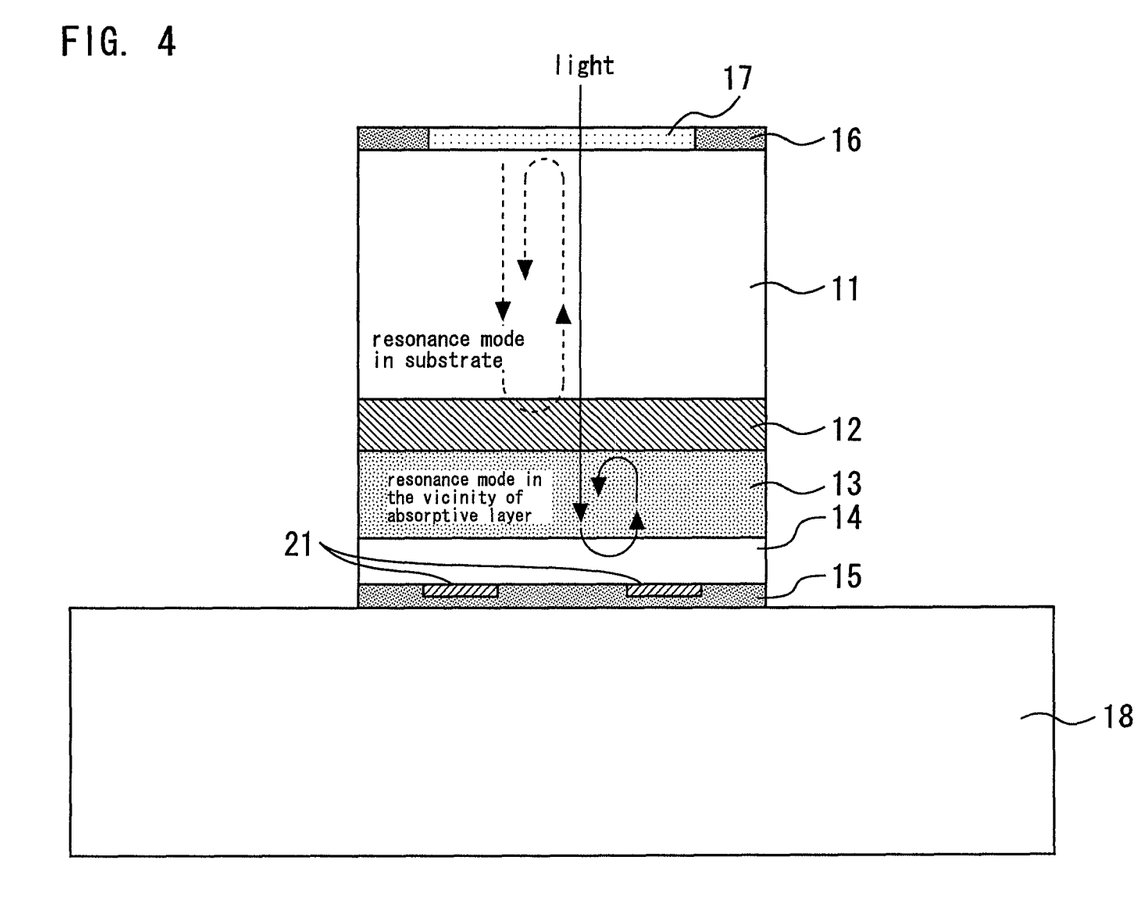
FIG. 4 is a sectional view showing a semiconductor light receiving element according to the second embodiment of the present invention.

FIG. 4 is a sectional view showing a semiconductor light receiving element according to the second embodiment of the present invention. A ring-shaped contact layer 21 is disposed on the peripheral portion of an anode 15 (second reflective layer) disposed in a light-receiving region, and is connected to a p-type phase adjusting layer 14. As the contact layer 21, a semiconductor layer having a smaller band gap than a band gap of the p-type phase adjusting layer 14, such as InGaAs and InGaAsP layers, or a metal having low contact resistance, such as AuZn, is used. Other configurations are identical to the configuration of the first embodiment.

Since the contact resistance of the anode 15 and the p-type phase adjusting layer 14 is lowered by the contact layer 21, heat generation is suppressed, and quantum efficiency is stabilized. The contact layer 21 may be provided on the entire surface between the p-type phase adjusting layer 14 and the anode 15. However, since the contact layer 21 has a low reflectivity to light, if the contact layer 21 is provided only outside the light-receiving region as described above, the resistance can be lowered without reducing reflectivity.

Third Embodiment

Figure 5:
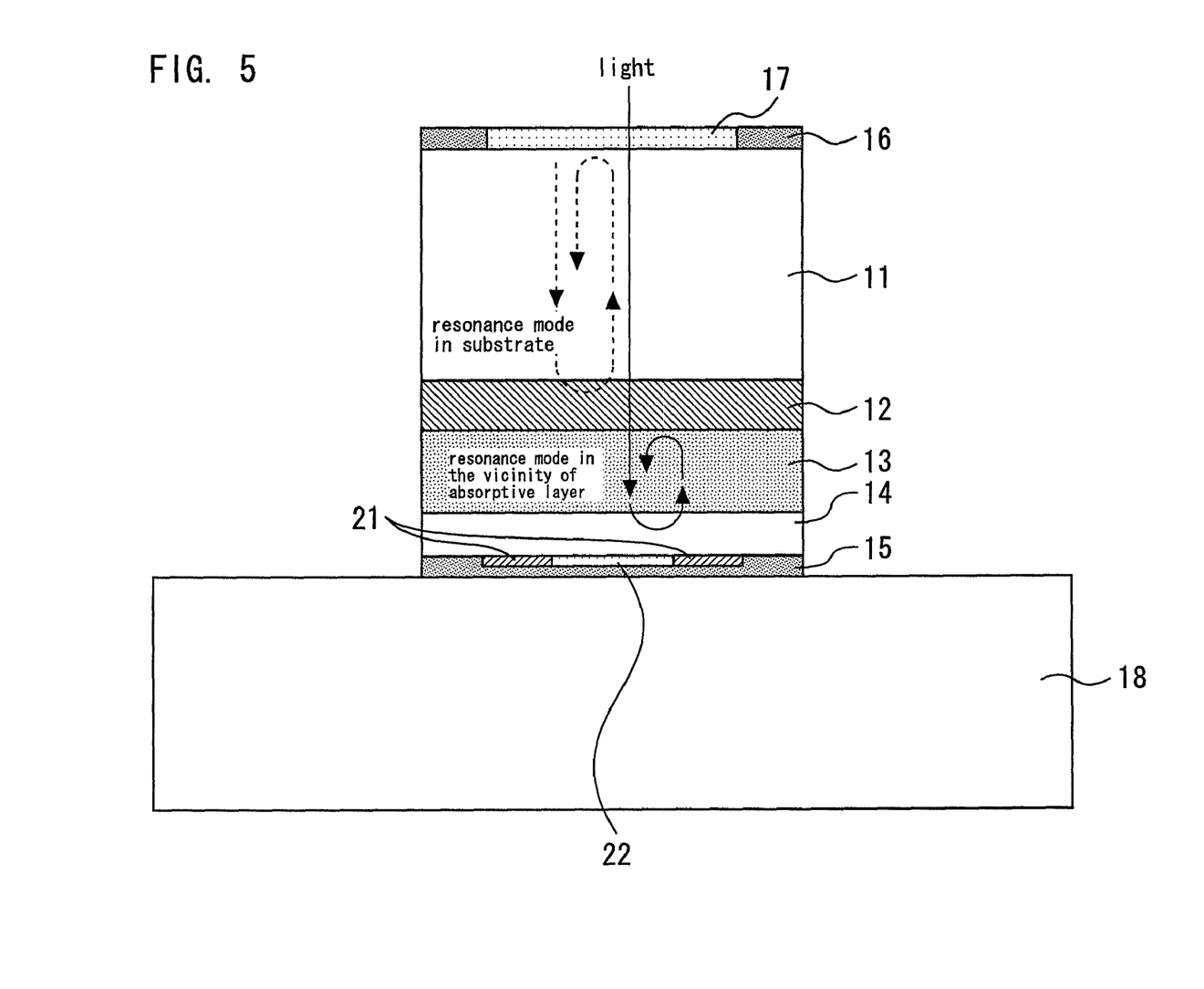
FIG. 5 is a sectional view showing a semiconductor light receiving element according to the third embodiment of the present invention.

FIG. 5 is a sectional view showing a semiconductor light receiving element according to the third embodiment of the present invention. A reflection enhancing layer 22 (second reflective layer) having a high reflectivity is provided in the light-receiving region receiving light on a p-type phase adjusting layer 14. A ring-shaped contact layer 21 is disposed on the peripheral portion of the reflection enhancing layer 22, and is connected to the p-type phase adjusting layer 14. An anode 15 (metal film) is provided on the reflection enhancing layer 22 and the contact layer 21. Other configurations are identical to the configuration of the first embodiment.

By providing the reflection enhancing layer 22, the quantum efficiency of the PD can be further elevated. As the reflection enhancing layer 22, a single-layer or multilayer film of a dielectric material, such as $Si_3N_4$, $SiO_2$, amorphous Si, $Al_2O_3$, and $TiO_2$ can be used. In this case, since the alloying of the p-type phase adjusting layer 14 and the anode 15 is suppressed, the reflectivity can be elevated. As the reflection enhancing layer 22, a single-layer or multilayer film of a semiconductor may also be used. For example, if a multilayer reflective layer is used as the reflection enhancing layer 22, the reflectivity can be more elevated.

If a multilayer film of a dielectric material or a semiconductor is used as the reflection enhancing layer 22, and the optical film thickness is adjusted, the reflection enhancing layer 22 also functions as a phase adjusting layer to generate resonance in the absorptive layer 13.

If the anode 15 and the p-type phase adjusting layer 14 are alloyed, the reflectivity is lowered. Therefore, as the reflection enhancing layer 22 provided between the anode 15 and the p-type phase adjusting layer 14, a metal difficult to alloy with the p-type phase adjusting layer 14 (barrier metal), such as platinum, molybdenum, Ni, Cr, and Ti may also be used. In other words, as the reflection enhancing layer 22, a metal whose connection to the p-type phase adjusting layer 14 becomes Schottky junction is used. Thereby, the reflectivity from the anode 15 can be elevated. However, there is the possibility to elevate connection resistance in low optical current operation due to the Schottky junction. Therefore, as a contact layer 21 disposed around the light-receiving region, a metal whose connection to the p-type phase adjusting layer 14 becomes an ohmic connection, such as AuZn, Ti, and Cr, is used. Thereby, a high reflectivity can be achieved without deteriorating connection resistance.

Fourth Embodiment

Figure 6:
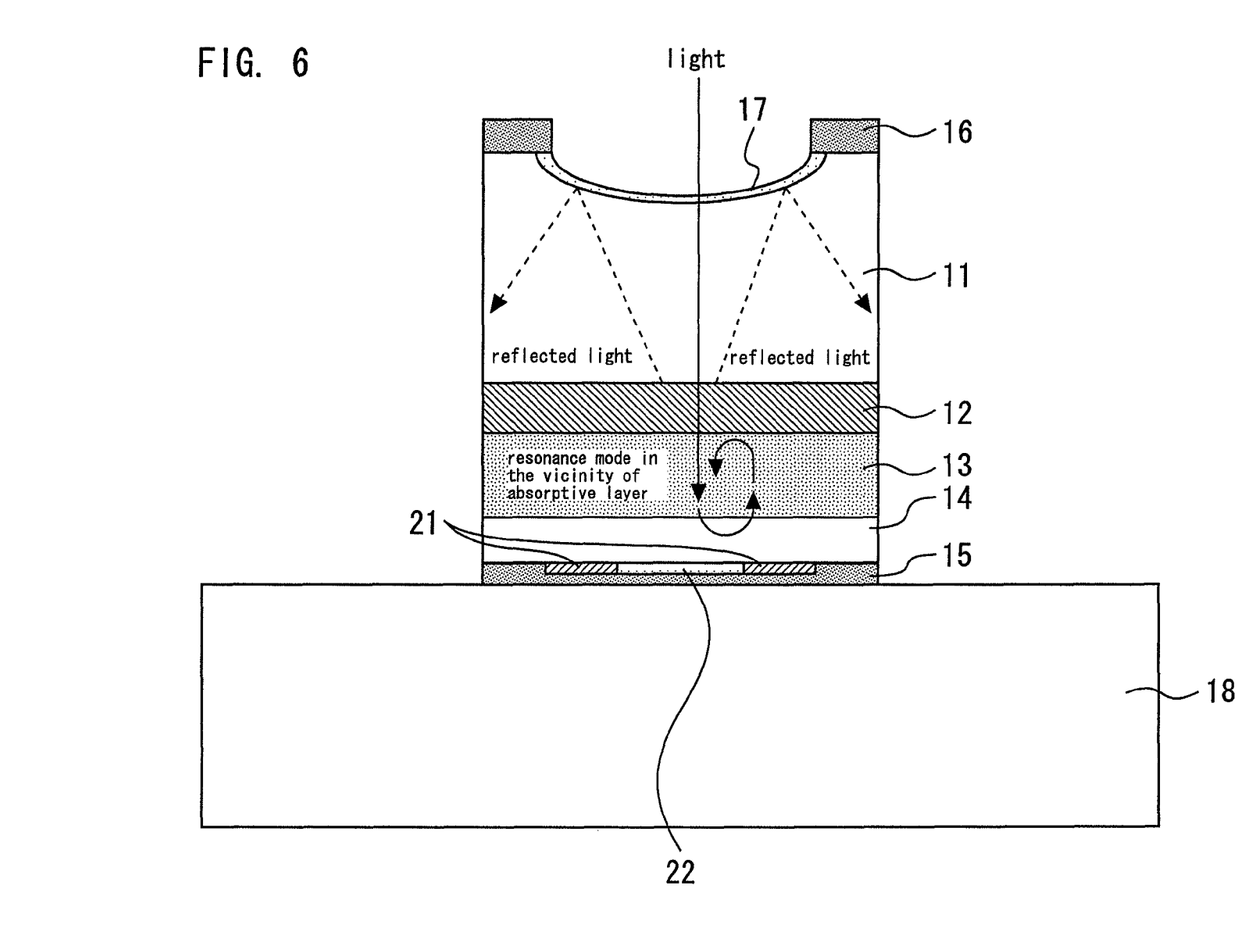
FIG. 6 is a sectional view showing a semiconductor light receiving element according to the fourth embodiment of the present invention.

FIG. 6 is a sectional view showing a semiconductor light receiving element according to the fourth embodiment of the present invention. The upper surface (second major surface) of an n-type InP substrate 11, which is a light incident surface provided with an anti-reflection film 17, is processed to be concave. Other configurations are identical to the configuration of the third embodiment.

In this case, even if the returned light reflected by the n-type multilayer reflective layer 12 is reflected again by, for example, the anti-reflection film 17, the light is diffused out of the light-receiving region, and does not return to the light-receiving region. As a result, since no resonance mode is generated in the n-type InP substrate 11, wavelength stability can be further improved.

Fifth Embodiment

Figure 7:
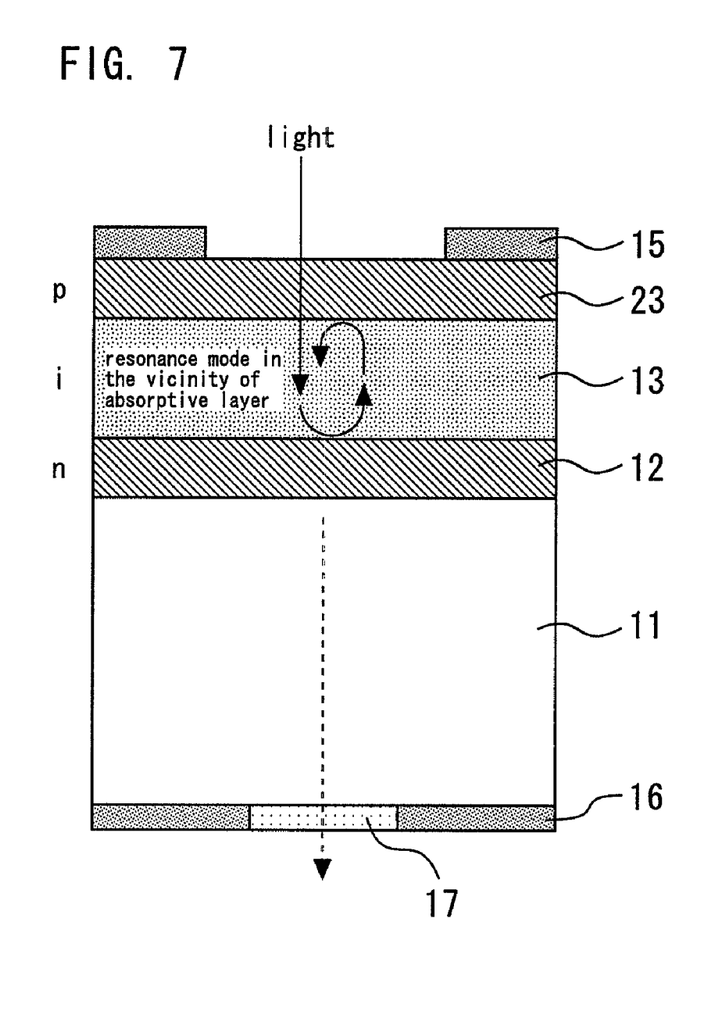
FIG. 7 is a sectional view showing a semiconductor light receiving element according to the fifth embodiment of the present invention.

FIG. 7 is a sectional view showing a semiconductor light receiving element according to the fifth embodiment of the present invention. The semiconductor light receiving element according to the fifth embodiment is a front-side incidence resonance PD.

An n-type InP substrate 11 (semiconductor substrate) has an upper surface (first major surface) and a lower surface (second major surface) opposite to each other. An n-type multilayer reflective layer 12 (first reflective layer), an absorptive layer 13, a p-type multilayer reflective layer 23 (second reflective layer), and an anode 15 are formed sequentially on the upper surface of the n-type InP substrate 11 from the side of the n-type InP substrate 11. A cathode 16 is formed on the lower surface of the n-type InP substrate 11. The cathode 16 (electrode) has an opening just under a light-receiving region. An anti-reflection film 17 is provided in the opening of the cathode 16.

The n-type multilayer reflective layer 12 and the p-type multilayer reflective layer 23 are multilayer reflective layers formed by laminating semiconductor layers having different refractive indices. The absorptive layer 13 is composed of a material having a smaller band gap than a band gap of the n-type InP substrate 11, such as InGaAs, InGaAsP and AlGaInAs, normally having a low carrier concentration.

Light is transmitted from the opening of the cathode 16 through the anti-reflection film 17 and goes out of the n-type InP substrate 11. Thereby, since the resonance mode is not generated in the n-type InP substrate 11 present between the n-type multilayer reflective layer 12 and the cathode 16, wavelength stability can be improved.

Sixth Embodiment

Figure 8:
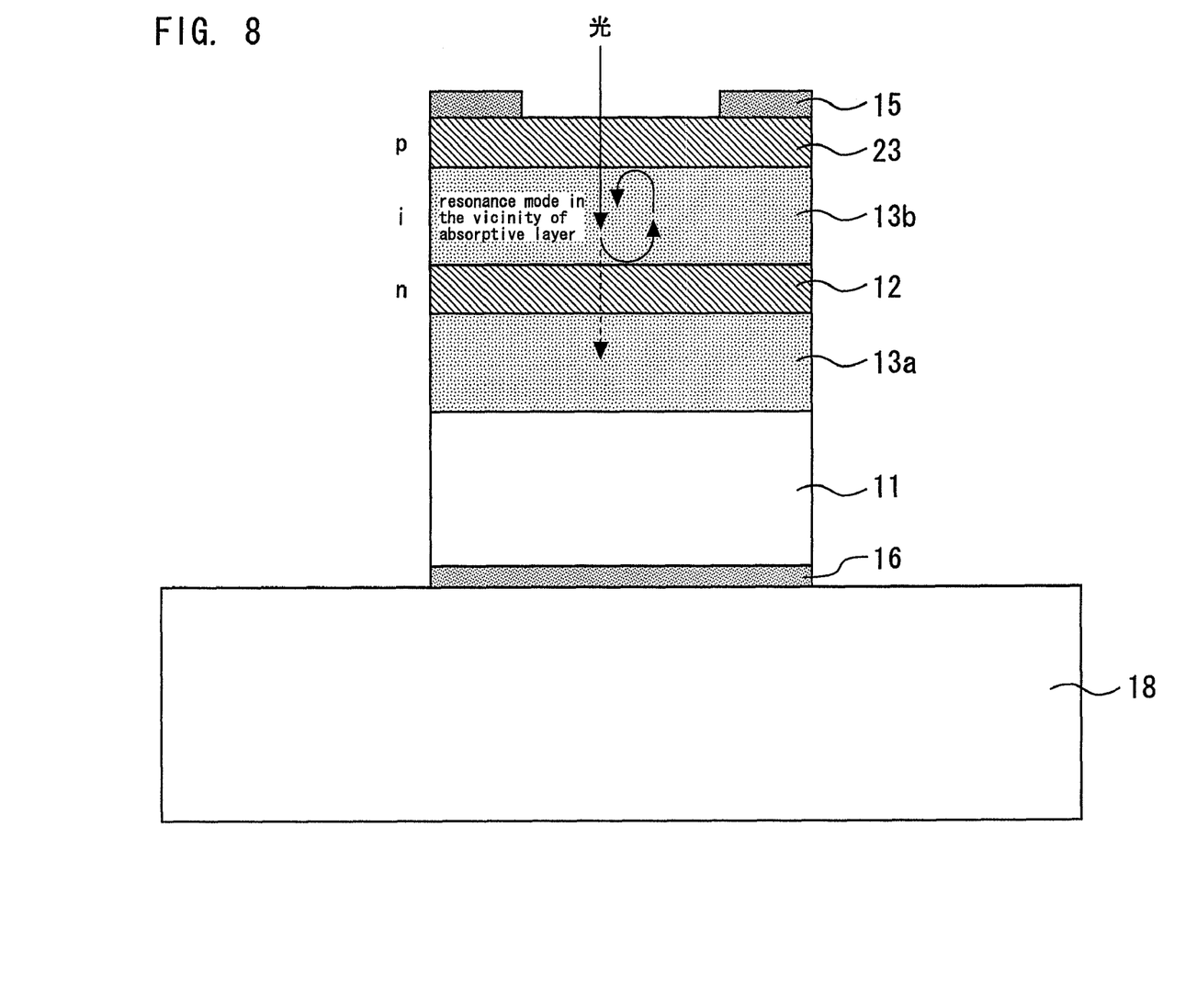
FIG. 8 is a sectional view showing a semiconductor light receiving element according to the sixth embodiment of the present invention.

FIG. 8 is a sectional view showing a semiconductor light receiving element according to the sixth embodiment of the present invention. The semiconductor light receiving element according to the sixth embodiment is a front-side incidence resonance PD.

An n-type InP substrate 11 (semiconductor substrate) has an upper surface (first major surface) and a lower surface (second major surface) opposite to each other. A first absorptive layer 13a, an n-type multilayer reflective layer 12 (first reflective layer), a second absorptive layer 13b, a p-type multilayer reflective layer 23 (second reflective layer), and an anode 15 are formed sequentially on the upper surface of the n-type InP substrate 11 from the side of the n-type InP substrate 11. An anti-reflection film 17 is formed on the lower surface of the n-type InP substrate 11.

The n-type multilayer reflective layer 12 and the p-type multilayer reflective layer 23 are multilayer reflective layers formed by laminating semiconductor layers having different refractive indices. Each of the first and second absorptive layers 13a and 13b is composed of a material having a smaller band gap than a band gap of the n-type InP substrate 11, such as InGaAs, InGaAsP and AlGaInAs, normally having a low carrier concentration.

By inserting the first absorptive layer 13a between the n-type InP substrate 11 and the n-type multilayer reflective layer 12, light transmitted through the n-type multilayer reflective layer 12 is absorbed in the first absorptive layer 13a. Thereby, since the resonance mode is not generated in the n-type InP substrate 11 present between the n-type multilayer reflective layer 12 and the cathode 16, wavelength stability can be improved.

Seventh Embodiment

In the seventh embodiment, a part of the n-type multilayer reflective layer 12 shown in FIG. 1 is a multiplier layer of an avalanche photodiode. Specifically, the optical film thickness of the multiplier layer is determined so as to be a part of the n-type multilayer reflective layer 12. Alternatively, a multiplier layer may be provided in a p-type phase adjusting layer 14. Other configurations are identical to the configuration of the first embodiment. The present invention can be thus applied to an avalanche photodiode.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2008-047334, filed on Feb. 28, 2008 including specification, claims, drawings and summary, on which the Convention priority of the present application is based, are incorporated herein by reference in its entirety.

What is claimed is:

1. A semiconductor light detecting element comprising:
   a semiconductor substrate having a bandgap energy, a first major surface, and a second major surface opposite said first major surface;
   a first light reflective structure, a light absorptive layer, a phase adjusting layer, and a second light reflective structure, sequentially disposed, from said semiconductor substrate, on said first major surface of said semiconductor substrate; and
   an anti-reflection film on said second major surface of said semiconductor substrate, wherein
   said first light reflective structure includes a multilayer light reflective structure comprising laminated semiconductor layers having different refractive indices, each semiconductor layer having a respective optical thickness of $n\lambda/4$, wherein n is an odd positive integer and $\lambda$ is the wavelength of incident light detected by said semiconductor light detecting element,
   said light absorptive layer has a band gap energy smaller than the band gap energy of said semiconductor substrate,
   said phase adjusting layer has a band gap energy larger than the band gap energy of said light absorptive layer,
   said first light reflective structure contacts said light absorptive layer without intervention of other layers,
   said first light reflective structure contacts said first major surface of
   said semiconductor substrate without intervention of other layers,
   said second light reflective structure contacts said phase adjusting layer without intervention of other layers, and
   said phase adjusting layer contacts said light absorptive layer without intervention of other layers, wherein said first and second light reflective structures, sandwiching said light absorptive layer and said phase adjusting layer, establish only a single resonator in which the incident light detected by said semiconductor light detecting element reciprocates between said first and second light reflective structures.

2. The semiconductor light detecting element according to claim 1, wherein said light absorptive layer is thicker than said phase adjusting layer.

3. The semiconductor light detecting element according to claim 1, wherein said second light reflective structure is a metal film.

4. The semiconductor light detecting element according to claim 3, wherein said second light reflective structure and said phase adjusting layer form a Schottky junction.

5. The semiconductor light detecting element according to claim 1, further comprising a contact layer disposed around said second light reflective structure and connected to said phase adjusting layer.

6. The semiconductor light detecting element according to claim 1, wherein said second light reflective structure includes a reflection enhancing layer that is a single-layer or a multilayer film of a dielectric material or a semiconductor.

7. The semiconductor light detecting element according to claim 6, wherein said second light reflective structure includes a metal film on said reflection enhancing layer.

8. The semiconductor light detecting element according to claim 1, wherein said second major surface of said semiconductor substrate is concave.

9. The semiconductor light detecting element according to claim 1, wherein part of said multilayer light reflective structure or part of said phase adjusting layer is a multiplier layer of an avalanche photodiode.

10. The semiconductor light detecting element according to claim 1, wherein total optical thickness of said light absorptive layer and said phase adjusting layer between said first and second light reflective structures is a positive integer multiple of $\lambda/4$.

11. A semiconductor light detecting element comprising:
a semiconductor substrate having a bandgap energy, a first major surface, and a second major surface opposite said first major surface;
a first light reflective structure, a light absorptive layer, and a second light reflective structure sequentially disposed, from said semiconductor substrate, on said first major surface of said semiconductor substrate;
a first electrode having an opening, said first electrode being disposed on said second major surface of said semiconductor substrate;
an anti-reflection film in said opening of said first electrode, wherein
said first and second light reflective structures include multilayer light reflective structures comprising laminated semiconductor layers having different refractive indices,
each semiconductor layer has a respective optical thickness of $n\lambda/4$, wherein n is an odd positive integer and $\lambda$ is the wavelength of incident light detected by said semiconductor light detecting element,
said light absorptive layer has a band gap energy smaller than the band gap energy of said semiconductor substrate,
said first light reflective structure contacts said first major surface of said semiconductor substrate without intervention of other layers,
said first light reflective structure contacts said light absorptive layer without intervention of other layers, and
said second light reflective structure contacts said light absorptive layer without intervention of other layers, wherein said first and second light reflective structures, sandwiching said light absorptive layer, establish only a single resonator in which the incident light detected by said semiconductor light detecting element reciprocates between said first and second light reflective structures.

12. The semiconductor light detecting element according to claim 11, further including a second electrode having a central opening, said second electrode being disposed on and in contact with said second light reflective structure.

13. A semiconductor light detecting element comprising:
a semiconductor substrate having a bandgap energy, a first major surface, and a second major surface opposite said first major surface;
a first light absorptive layer, a first light reflective structure having a first conductivity type, a second light absorptive layer, and a second light reflective structure having a second conductivity type, opposite the first conductivity type, sequentially disposed, from said semiconductor substrate, on said first major surface of said semiconductor substrate; and
an anti-reflection film on said second major surface of said semiconductor substrate, wherein
said first and second light reflective structures include multilayer light reflective structures including laminated semiconductor layers having different refractive indices,
each semiconductor layer has a respective optical thickness of $n\lambda/4$, wherein n is an odd positive integer and $\lambda$ is the wavelength of incident light detected by said semiconductor light detecting element,
said first and second light absorptive layers have band gap energies smaller than the band gap energy of said semiconductor substrate,
said first and second light absorptive layers contact said first light reflective structure without intervention of other layers, and
said second light reflective structure contacts said second light absorptive layer without intervention of other layers, wherein said first and second light reflective structures, sandwiching said second light absorptive layer, establish only a single resonator in which the incident light detected by said semiconductor light detecting element reciprocates between said first and second light reflective structures.

14. The semiconductor light detecting element according to claim 13, further including an electrode having a central opening and disposed on and in contact with said second light reflective structure.

* * * * *